(12) United States Patent
Finarov

(10) Patent No.: US 6,426,502 B1
(45) Date of Patent: Jul. 30, 2002

(54) APPARATUS FOR INTEGRATED MONITORING OF WAFERS AND FOR PROCESS CONTROL IN THE SEMICONDUCTOR MANUFACTURING AND A METHOD FOR USE THEREOF

(75) Inventor: Moshe Finarov, Rehovot (IL)

(73) Assignee: Nova Measuring Instruments Ltd., Rehovot (IL)

( * ) Notice: Subject to any disclaimer, the term of this patent is extended or adjusted under 35 U.S.C. 154(b) by 0 days.

(21) Appl. No.: 09/509,080
(22) PCT Filed: Nov. 7, 1999
(86) PCT No.: PCT/IL99/00598
§ 371 (c)(1), (2), (4) Date: Mar. 22, 2000
(87) PCT Pub. No.: WO00/28577
PCT Pub. Date: May 18, 2000

(30) Foreign Application Priority Data

Nov. 8, 1998 (IL) .................................. 126949

(51) Int. Cl.⁷ .................................. G01J 1/20
(52) U.S. Cl. .................... 250/348; 250/347; 250/338.1; 250/559.23
(58) Field of Search ................................ 250/348, 347, 250/338.1, 559.23

(56) References Cited

U.S. PATENT DOCUMENTS

| | | | |
|---|---|---|---|
| 5,270,560 A | * 12/1993 | Cheng | 250/559.23 |
| 5,517,312 A | 5/1996 | Finarov | |
| 5,604,344 A | 2/1997 | Finarov | |
| 5,682,242 A | 10/1997 | Eylon | |
| 5,764,365 A | 6/1998 | Finarov | |
| 5,766,360 A | 6/1998 | Sato et al. | |

FOREIGN PATENT DOCUMENTS

| | | |
|---|---|---|
| EP | 0 412 728 | 2/1991 |
| JP | 9-50959 | 2/1997 |
| WO | 95/11446 | 4/1995 |

OTHER PUBLICATIONS (1) International Search Report.
(2) Dishon et al., "Monitoring Choices of CMP Planarization Processes", pp. 1–10, Feb. 1997.
(3) English Language Abstract of JP 9–50959.

* cited by examiner

Primary Examiner—Constantine Hannaher
Assistant Examiner—Andrew Israel
(74) Attorney, Agent, or Firm—Lowe Hauptman Gilman & Berner, LLP

(57) ABSTRACT

The present invention relates to an integrated apparatus for monitoring wafers and for process control in the semiconductor manufacturing process, by means of optical measurements at more than one spectral range that can be installed inside any part of the semiconductor production line, i.e., inside the photocluster equipment, the CVD equipment or the CMP equipment. The apparatus comprises a measuring unit (110) for performing optical measurements in predetermined sites on said wafer, illumination sources for illuminating said wafer via measuring unit (10,50), supporting means (30) for holding, rotating and translating the wafer and a control unit (120). The measuring unit (110) comprises: (a) at least two separate optical units, each operating at a different distinct spectral range; (b) a separate optical window for each optical unit (31, 32); (c) at least one movable optical head (34); (d) mechanical means for translating said optical head relatively to the wafer's surface.

21 Claims, 8 Drawing Sheets

APPARATUS FOR INTEGRATED MONITORING OF WAFERS AND FOR PROCESS CONTROL IN THE SEMICONDUCTOR MANUFACTURING AND A METHOD FOR USE THEREOF

FIELD OF THE INVENTION

The present invention relates to the semiconductor industry in general, and to an apparatus for monitoring wafers and process control in the semiconductor processing and a method for use thereof, in particular.

BACKGROUND OF THE INVENTION

The current trends of shrinking dimensions in the semiconductors industry and the dynamic nature of the processes involved in the semiconductor manufacturing, increase the need for accurate diagnostic tools, capable of providing real time measurements for short time to-respond feedback loops, such as closed loop control and feedforward control. Such stringent requirements cannot be obtained by off-line ("stand alone") measuring systems, which do not provide a real time response. Inspection and measuring by such systems, however precise and accurate they are, slow-down the manufacturing process and consume valuable time and clean room space. On the other hand, in-situ detection devices such as end-point detection devices, which are used at different stages of the production line, although they provide real-time monitoring, their performance is not accurate enough. Such devices are exposed to the conditions in the active area of the production line, thus the data obtained by them is rather an averaging over a relatively large area and they cannot provide mapping capabilities. This situation enhanced the development of a fundamental solution by means of integrated monitoring and process control, i.e., physical implementation of monitoring tools, with full metrology capabilities, within the production line in the semiconductor fabrication plant. (Dishon, G., Finarov, M., Kipper, R. (1997) Monitoring choices of CMP planarization process, $2^{nd}$ International CMP planarization conference, February 13–14, Santa Clara, Calif. )

The terms "integrated apparatus" or "integrated device" as used in the present invention refers to an apparatus that is physically installed inside the processing equipment or is attached to it and is dedicated to a specific process. Wafers are transferred to said apparatus by the same robot which serves the processing equipment.

Integrated devices should be considered from several aspects and meet specific requirements in order to become real and feasible:

(a) Small footprint—an integrated device should have as small footprint as possible in order to be physically installed inside the Processing Equipment (hereinafter called PE), e.g., inside the Chemical Vapor Deposition (hereinafter called CVD) equipment, inside the Chemical Mechanical Polishing (hereinafter called CMP) polisher or inside the photocluster equipment;

(b) Separation of the measuring unit from the PE environment, e.g., using sealed enclosure. This is aimed at two objectives:
  (I) Cleanliness—measuring unit must not interfere in any way with the operation of the PE or introduce any potential risk for contamination;
  (II) To enable the application of certain conditions inside the integrated apparatus, such as pressurized gases in the CMP equipment (in order to prevent water vapor from penetrating the apparatus);

(c) Maintaining a stationary wafer during measurement in order to minimize system's footprint and to exclude extra wafer handling;

(d) High speed measuring unit (e.g., fast positioning, autofocusing and measurement);

(e) Means to directly respond to a certain cause with the correct straightforward correction action.

(f) Easy and quick maintenance by simple replacement of each functioning unit (component).

(g) Having the option to be bypassed by the production process and to operate at off-line mode.

In addition to the aforementioned specific design requirements, integrated device should have other general functions as described hereinafter. Reference is made to FIG. 1, prior art, which generally illustrates an integrated apparatus which measures the thickness of thin films on the surface of a silicon wafer (the metrology device known as Integrated Thickness Monitoring system—ITM NovaScan 210, commercially available from Nova measuring instruments Ltd., Rehovot, Israel). The prior art will be described using this metrology device. In general, the known metrology apparatus of FIG. 1 comprises an optical measurement unit (MU) 1, an external light source 10 and a control unit (CU) 2, which controls the movement and image acquisition of the optical measurement system 1 as well as the operation of the external light source 10. The optical measurement system 'sees' the wafer through an optical window 3. Optical measurement system 1 typically comprises an optical unit 4, whose optical path is shown in detail in FIG. 2, a translation system 5 capable of allocating measurement at any point on the wafer w, such as an X-Y stage, and data and image processing unit 6 forming part of the control unit 2. The optical path for the exemplary apparatus is illustrated in FIG. 2 and is described hereinafter. The optical unit comprises an external (to the MU 1) white light source 10, an optic fiber 11, a condenser 12, which directs the light onto a beam splitter 13, a focusing target 25, a tube lens 14, a translatable objective 15, an optical window 3 and the wafer's plan w. Behind the beam splitter 13 are located a pinhole mirror 16, a relay lens 17 and a CCD camera 18. Behind the pinhole mirror 16 there is another relay lens 19, a mirror 20 and a spectrophotometer 21. For the apparatus described here, only the objective 15 is translated, parallel to the wafer's plan w. A light beam 22 emanates from the external light source 10, is conveyed to the MU 1 by fiber optic 11. It enters the MU 1, to the condenser 12 till beam splitter 13 which deflects it toward the wafer w, via lenses 14 and 15 (mirrors which serve as well to convey light beam 22 are not shown) The reflected light beam (not labeled) is transmitted by lenses 14 and 15, passes through beam splitter 13 and is deflected by pinhole mirror 16 to the CCD camera 18 where the image acquisition takes place. The portion of the light beam, which passes through the pinhole in the pinhole mirror 16, reaches the spectrophotometer 21. The focusing target 25 is any high contrast object, such as a metallic pattern on a glass substrate. The pattern can be any easily identifiable pattern, such as a contrast edge, a grid, etc. The main two functions of the optical unit 4 are the positioning (including focusing, image acquisition and image processing) channel 100 and the measuring (including illumination and detection) channel 200. The positioning channel 100 is aimed at identifying the exact location of the wafer w and the specific sites on the wafer w where measurements have to be done. Autofocusing using, among other things, focusing target 25, is performed according to any method known in the art. Such a method based on the patterned features on the wafers is disclosed in U.S. Pat. No.

5,604,344. After the positioning and autofocusing are done, the objective 15 is located above the predetermined location on the wafer w. Now, a measurement is conducted by the measuring channel 200. It should be noted that the positioning channel 100 and the measuring channel 200 are partly composed of the same optical elements as shown in FIG. 2, especially with respect to the moving optical head which is the objective 15 in this case. This overlap is feasible, mainly because both channels 100 and 200 in the ITM NovaScan 210 use almost the same spectral range. A direct result of this situation is that single optical window 3 is capable to serve both channels.

However, another situation is when an integrated measurement device uses different wavelengths for the positioning channel and for the measuring channel, or when optical measurements are required at more than one spectral range. For example, a method for layer composition measurements and contamination analysis during the CVD process is conducted by infrared optical assembly which cannot be used for the positioning channel 100. Therefore, with respect to applications when different wavelengths are used for positioning and for measurements or when measurements at different spectral ranges are required, a new shortcoming of the common integrated devices arises: due to optics limitations, both positioning channel 100 and measuring channel 200 cannot use the same optical elements and the optical window 3 cannot serve both channels, as known to a man skilled in the art. With respect to the known ITM NovaScan 210 presented above, optical window 3 designed for positioning channel 100 and operation under visible light conditions, cannot serve UV, Infrared or X-rays measuring. Moreover, recalling the specific requirements for integrated device, this problem cannot be solved by installing two different optical windows with similar dimensions to those of optical window 3 due to footprint limitations. Alternatively, a permanent omission of the optical window 3 is not practical because of the requirement to separate the MU 1 from its environment.

Therefore, the objectives of the present invention is to overcome the aforementioned limitations:

(1) To provide an integrated apparatus for monitoring and process control under conditions where different spectral ranges are used for positioning, measurement, mapping and any other operation performed by the apparatus or any combination of such operations.

(2) To provide specifically an integrated apparatus for monitoring layers thickness and layers composition and for process control using visible light and FTIR, respectively.

(3) To provide specifically an integrated apparatus for monitoring the thickness and the photosensitivity of photoresist layers by using respectively, visible and ultraviolet spectrophotometry (4) To provide specifically an integrated apparatus for monitoring layers thickness and layers composition and for process control by using x-ray spectroscopy.

Hereinafter the term "optical unit" as used in the present invention means an assembly that includes all of the physical optical components that enables the performing of optical activities (e.g., measurements, image acquisition) at a specific spectral range, where the optical components comprise an illumination source, preferably external, a detector (e.g., spectrophotometer) or imaging device (e.g., area CCD) and a suitable combination of optical elements, such as lenses, beam splitters, mirrors, fiber optics and so on, for directing the input illumination beam toward the wafer and the output beam, from the wafer into the detector; The illumination source can be external to the measuring unit in which all the other components of the optical unit are assembled or can be installed within the measuring unit. In the first case the light beam is conveyed to the measuring unit by a suitable light guide. The term "channel" or "optical channel" as used in the present invention means the using of an "optical unit" for specific purpose and includes the communication with a control unit as well as electricity supply. Thus, an "optical unit" can serve more than one "channel", as in the example above. In this example of the ITM NovaScan 210, channels 100 and 200 operating at visible light, comprise nearly the same optical components (except a spectrophotometer and a CCD) denoted for convenience as optical unit 4 (wherein the light source 10 is part of unit 4).

SUMMARY OF THE INVENTION

It is the object of the present invention to overcome the limitations of the prior art. The present invention relates to an integrated apparatus for monitoring wafers and for process control in the semiconductor manufacturing process, by means of optical measurements at more than one spectral range, and a method for use thereof. Said apparatus comprising at least two separate optical units, each for measurements at a different spectral range wherein each unit uses a different optical window. The present invention further relates to a method for monitoring of wafers and for process control in the semiconductor manufacturing by optical measurements at more than one spectral range for any process in the semiconductor manufacturing and for the CVD process, in particular.

The apparatus according to the present invention comprises a measuring unit for performing optical measurements in predetermined sites on said wafer, illumination sources for illuminating said wafer via measuring unit, supporting means for holding, rotating and translating the wafer and a control unit connected to said measuring unit, to said supporting means and to said illumination sources. The measuring unit comprises: (a) at least two separate optical units, each operating at a different distinct spectral range; (b) a separate optical window for each optical unit through which the wafer is illuminated; (c) at least one movable optical head which includes part or all of the optical components of said optical units; (d) mechanical means for translating said optical head relatively to the wafer's surface such that each of said optical units can measure the whole area of the wafer through its corresponding optical window and perform autofocusing. The apparatus, according to the present invention, can be installed inside any part of the semiconductor production line, i.e., inside the photocluster equipment, the chemical vapor deposition (CVD) equipment or the chemical mechanical polishing (CMP) equipment.

In a preferred embodiment of the present invention, one optical unit, comprising of optical elements suitable for measurements in the visible range, is used for positioning and for obtaining spectroscopic data in the visible range. The other optical unit or units consist of optical elements suitable for measurements at any other spectral ranges, such as the infrared, ultraviolet or X-ray or at a specific wavelength.

In a preferred embodiment of the present invention, said apparatus is installed inside the CVD equipment cluster and comprises two optical units. One optical unit, comprising of optical elements suitable for measurements in the visible range of the electromagnetic spectrum, is used for positioning and for thickness measurements. The second optical unit is for layer composition measurements and contamination analysis and comprises of optical components suitable for measurements in the infrared range of the spectrum based on Fourier Transform Infrared spectrometry (FTIR).

In another preferred embodiment of the present invention, the second unit comprises optical elements suitable for illumination and optical measurements in the ultraviolet range of the spectrum, is used for illuminating a wafer by ultraviolet illumination and measuring the reflected signals by means of a detector.

Yet in another preferred embodiment of the present invention, the second unit comprises optical elements suitable for illumination and optical measurements in the X ray range of the spectrum, is used for illuminating a wafer by X ray radiation and measuring the reflected signals by means of a detector.

In a preferred embodiment of the present invention the measuring unit comprises two adjacent elongated windows of length equal to or longer than a semiconductor wafer radius and separated by a distance d. The wafer is held by a stable support with means for rotating the wafer around an axis perpendicular to its plane. The movable optical head has means to move along the window length, and either the supporting means of the wafer or the movable optical head have means for linear translation along the x axis perpendicular to the windows elongated axis and equal to the distance Δx between the windows' centers such that the wafer can be centered under one window or the other. This design of the windows, combined with the relative movements of wafer and optical head, enables each optical unit to measure any point on the surface of a wafer.

Yet, in another preferred embodiment of the present invention, the wafer's supporting means has means for accurate rotation, According to the present invention, there can be more than two optical units and corresponding windows, wherein the supporting means or the optical head have several positions or continuous translation with appropriate motion control along the x axis.

BRIEF DESCRIPTION OF THE DRAWINGS

The present invention will be further understood and clarified by the following drawing description. This description does not intend, in any way, to limit the scope of the present invention.

DETAILED DESCRIPTION OF THE INVENTION

It is common knowledge to people who are skilled in the art of the present invention, that application of different ranges of wavelengths for different purposes in a single apparatus is not feasible using the same optical elements for both ranges due to limitations of refractive and reflective optics. Thus generally, different optical components should be used for each distinct wavelengths range.

Therefore, in addition to the principles of integrated devices mentioned in the background, the design of the integrated monitoring apparatus should meet additional principles according to the purposes of the present invention:

(a) Separation between optical units that operate at different spectral ranges.

(b) A different optical window for each unit, made of materials transparent to illumination used at that unit. As an option, a window may be opened for a predetermined period of time to allow measurements under special conditions (such as X-ray measurements)

(c) Different illumination sources for each optical unit which can be either installed within the optical unit or can be external to said unit. In the latter case, separated means to convey the light (e.g. optic fiber) from each external source to its channel inside the sealed enclosure, are required as well.

Due to footprint limitation each window is smaller than a wafer (as compared to optical window 3) and therefore an additional principle is:

(d) Mechanical means to control the relative movement of the movable optical components with respect to the wafer in a way which enables each of the optical units to reach any point of the wafer w.

Detailed Description of Preferred Embodiments

Figure 1:
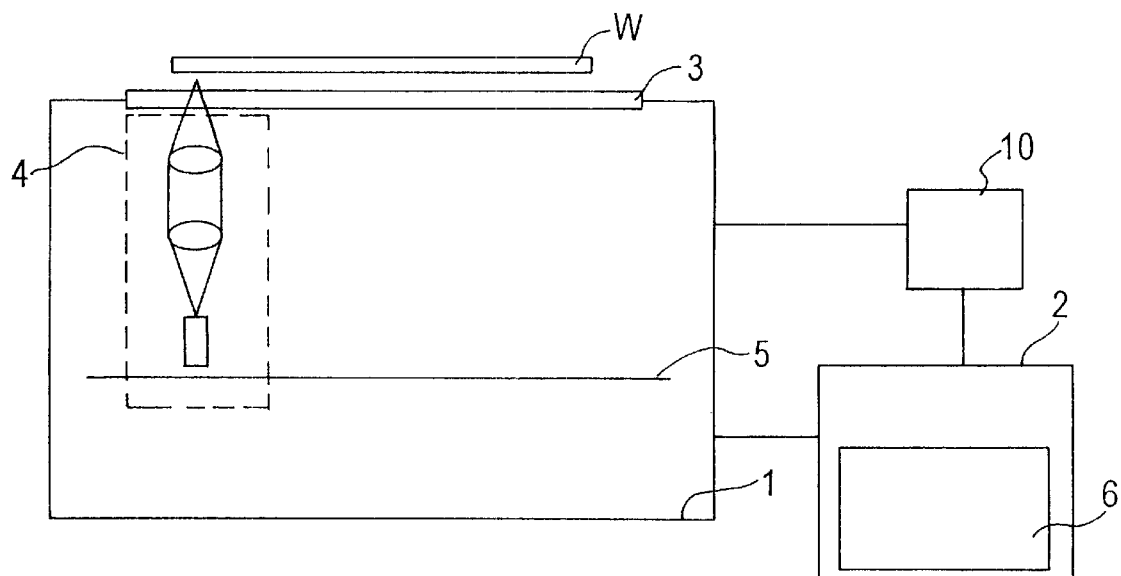
FIG. 1 is a schematic illustration of an exemplary known integrated metrology apparatus.
Figure 2:
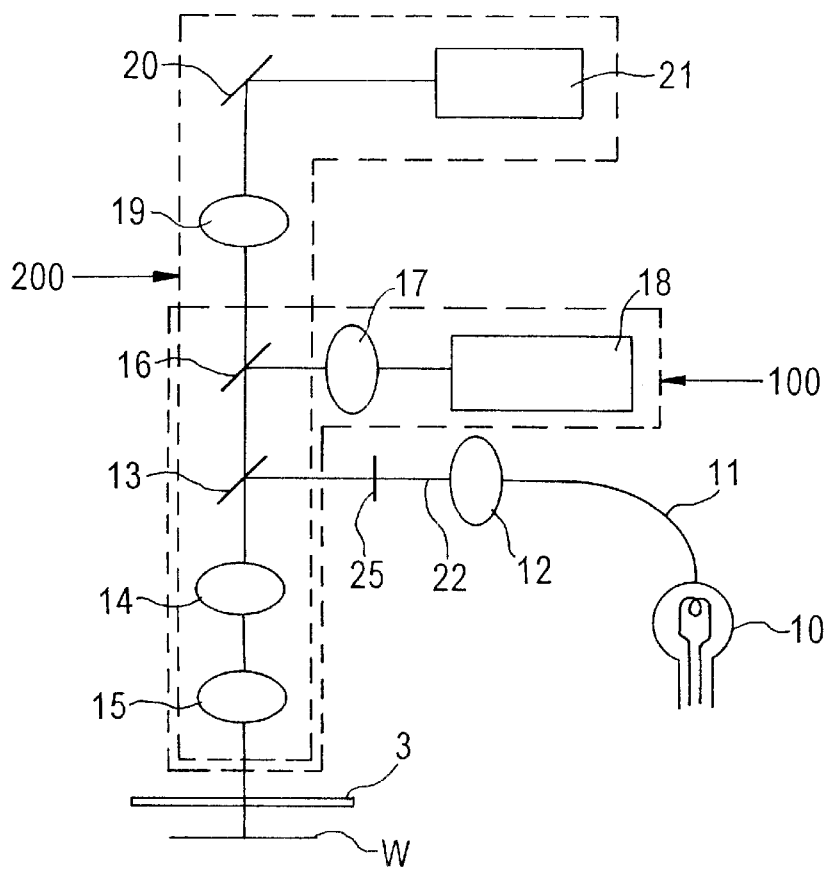
FIG. 2 is a schematic illustration of a known integrated apparatus optical unit.
Figure 3A:
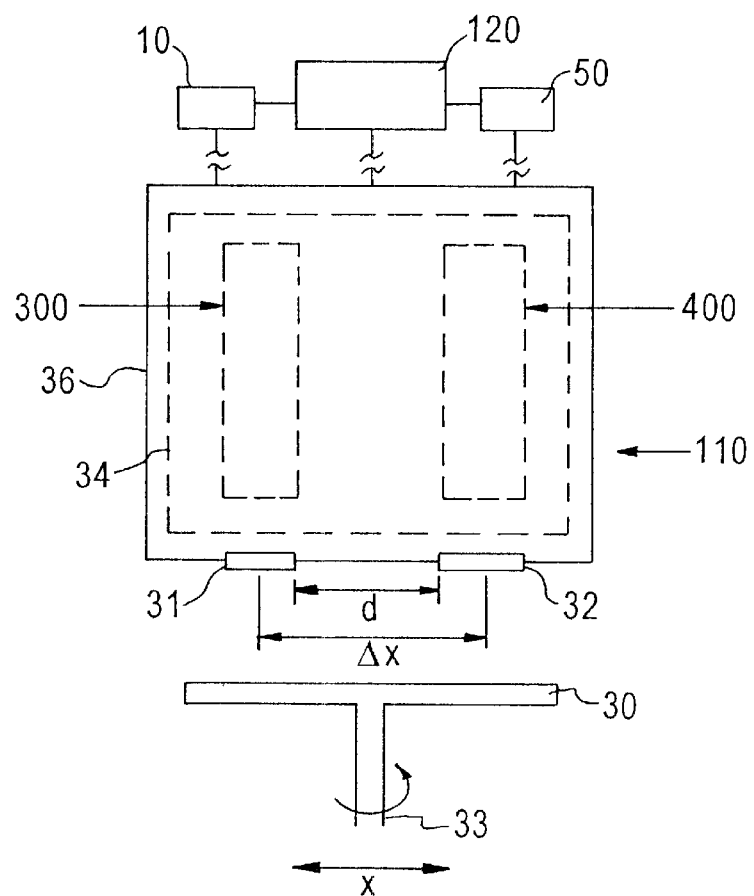
FIG. 3(a) is a schematic side view of an integrated apparatus according to a preferred embodiment of the present invention.

Reference now is made to FIG. 3(a), which schematically illustrates a side view of an integrated apparatus for monitoring and process control according to a preferred embodiment of the present invention. It comprises two external light sources 10 and 50, a measuring unit (MU) 110 and a control unit 120. The external light sources can be any illumination sources for different spectral ranges (e.g., deep UV, visible light, infrared). The light is conveyed to the MU 110 by light guides (e.g., fiber optics) (not shown). The MU 110 comprises a sealed enclosure 36 and in it there are three different channels: (i) a positioning channel, (ii) a measuring channel for visible light optical measurements, such as thickness measurements and (iii) a measuring channel 400 based on spectral range other than the visible range. Since both channels (i) and (ii) use the same spectral range, i.e., visible range, and have nearly the same optical components, they are physically combined into one optical unit in a similar way to the optical configuration presented in FIG. 2, and will be referred to as optical channel(s) 300 in FIG. 3(a). Channel 400 is realized in a separate optical unit. The apparatus comprises rigid and stable supporting means 30, which holds the wafer w during measurement. This can also be a vacuum chuck (not shown) which clamps the wafer w from its bottom side. In addition, the supporting means 30 has optionally the ability to rotate around an axis 33 and to move along the x axis (along the figure plane). The integrated apparatus has similar basic components (e.g., MU 1 and CU 2) as the aforementioned integrated tool (FIG. 1).

As shown in FIG. 3(a) positioning and measuring channel 300 is separated from measuring channel 400 and each of which comprises optical elements suitable for the applied spectral ranges. In addition, each of the channels 300 and 400 uses different optical windows 31 and 32. Positioning and measuring channel 300 is similar to the optical path of the ITM NovaScan 210 and is illustrated in FIG. 2. Reference is also made to the description of optical unit 4 and its optical path of FIG. 2 Which describes the optical components, optical function and operation of channel 300.

Figure 3B:
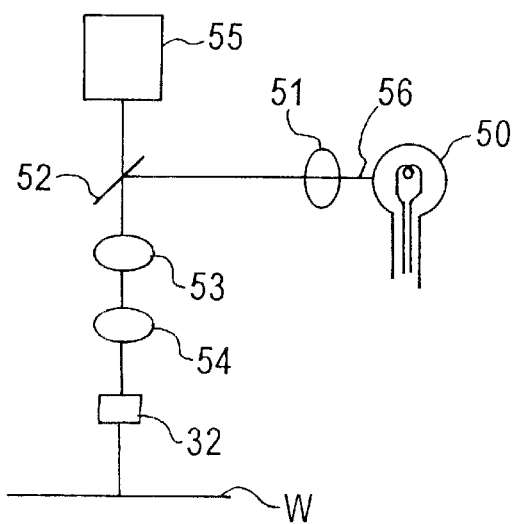
FIG. 3(b) illustrates the optical unit of the measuring channel of an integrated apparatus according to a preferred embodiment of the present invention.

FIG. 3(b) illustrates the second measuring channel 400 operating at a different spectral range. In this embodiment, it comprises an external illumination source 50, means to convey the light 56 to the measuring unit (e.g., a suitable fiber optic, suitable mirrors), a condenser 51, which directs the radiation onto a beam splitter 52, a tube lens 53, a translatable objective 54, optical window 32 and the wafer's plan w. Behind the beam splitter 52 located a suitable detector (e.g., spectrophotometer) 55. The beam splitter 52 receives a light beam emanating from the light source 50 via the convey means 56 and deflects it toward the wafer w, via lenses 53 and 54 and optical window 32. The reflected light beam (not labeled) is transmitted by lenses 54 and 53, passes through beam splitter 52 to the detector 55. It is obvious to a man skilled in the art that other components like concave mirrors etc. may be used as well. Both channels 300 and 400 are controlled by the control unit 120, as well as the light sources 10 and 50.

The movable parts of channels 300 and 400 (e.g., part of channels 300 and 400 or all their components) are mounted together in a single moveable optical head 34 as shown in FIG. 3(a). The optical head 34 can move along the y axis (normal to the drawing plan) and the z axis (vertical, for focusing in the wafer plan w), and optionally along the x axis.

Regarding the optical windows 31 and 32 (FIG. 3(a)), the integrated tool according to a preferred embodiment of the present invention has two strip-like optical windows, one for the positioning and measuring channel 300 and a second optical window 32 for the measuring channel 400. Each of which is made of material capable of transmitting the specific electromagnetic waves used in its channel. The width of the optical windows 31 and 32 is determined according to the field of view and numerical aperture of each of the 300 and 400 channels. In order to enable the optical head 34 to reach any point on the wafer w, the lengths of the optical windows 31 and 32 are equal or longer than the wafer's radius, preferably smaller than a wafer's diameter but a little bit bigger than a wafer's radius. In order to meet the demand for as small as possible footprint of the integrated tool, the physical separation d between the optical windows 31 and 32 is set to the possible minimum, such that the two windows are adjacent to each other. Therefore, the linear translation $\Delta x$ of the supporting means 30, or alternatively the optical head 34, along the x axis, should be no more than the distance between the optical windows 31 and 32 centers.

Figure 4:
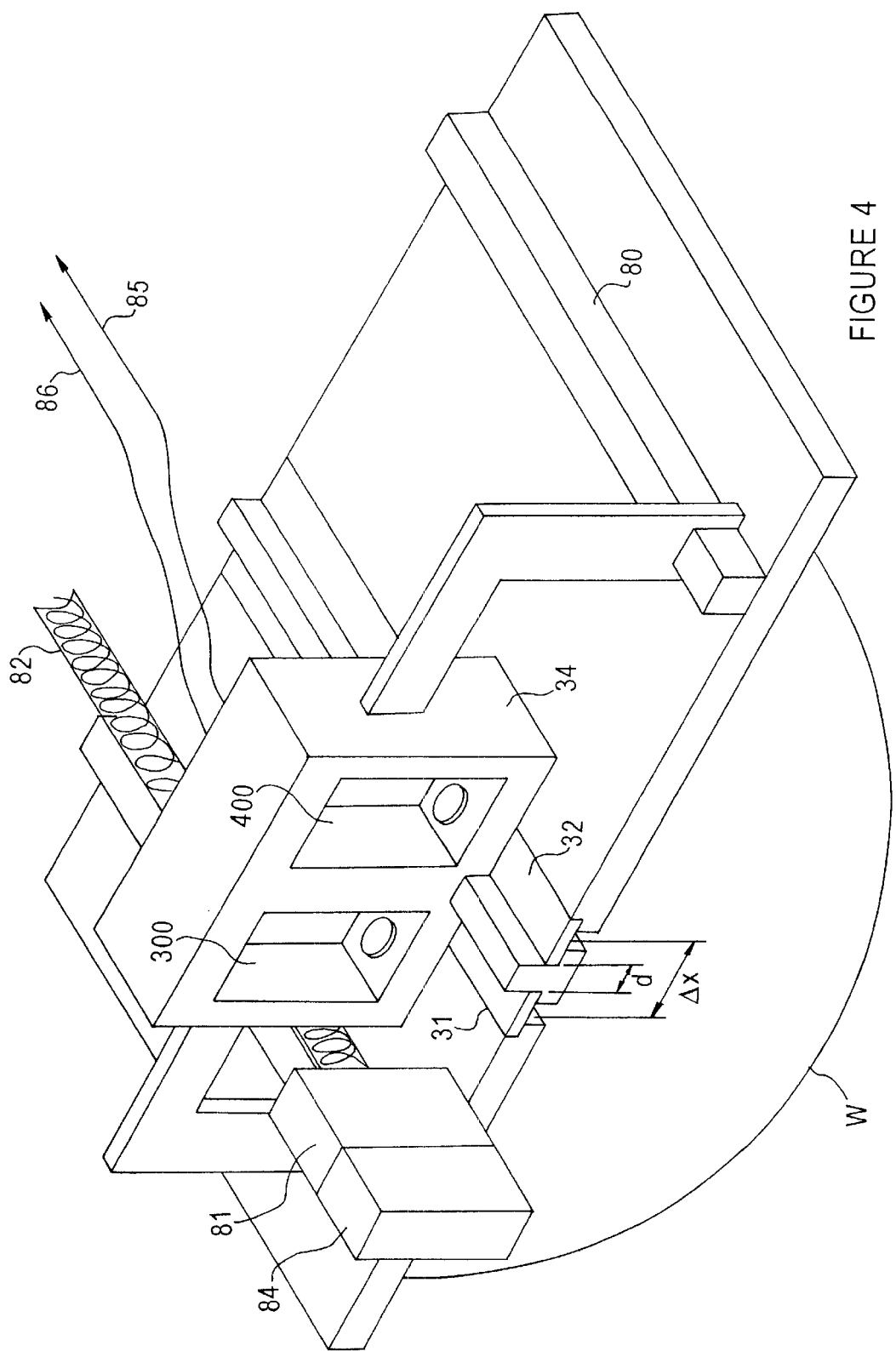
FIG. 4 is a three-dimensional side view of the integrated apparatus.

FIG. 4 illustrates a three-dimensional view of an integrated tool according to a preferred embodiment of the present invention. In this embodiment, both channels 300 and 400 are mounted inside a movable optical head 34. The optical head 34 moves on linear rails 80 along the y axis and above the optical windows 31 and 32 and the wafer w. The motion is performed by a motor 81 which drives a screw 82 connected to the optical head 34 (connection not shown). The motor is controlled by the CU (not shown) and monitored by an encoder 84. The optical head 34 is connected to the CU by electric wires 85 and to the external illuminations sources by optical means (e.g., optic fiber) 86 through which light, electric supply, and data are transferred.

According to a preferred embodiment of the present invention, the integrated apparatus is for monitoring and process control of dielectric layers thickness and composition, e.g., CVD equipment (hereinafter—ITM CVD). Its optical scheme is similar to that presented in FIG. 3(a), where channel 300 serves for positioning and for measuring layers thickness using visible light and channel 400 serves for layer composition measurements and for contamination analysis and is based on infrared optical components.

Figure 5A:
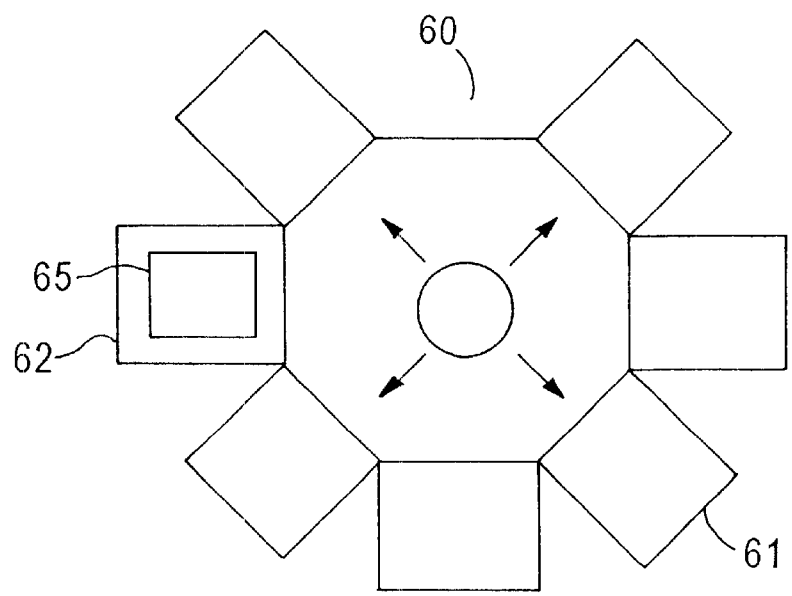
FIGS. 5(a) and 5(b) are possible implementations of ITM CVD apparatus within CVD equipment
Figure 5B:
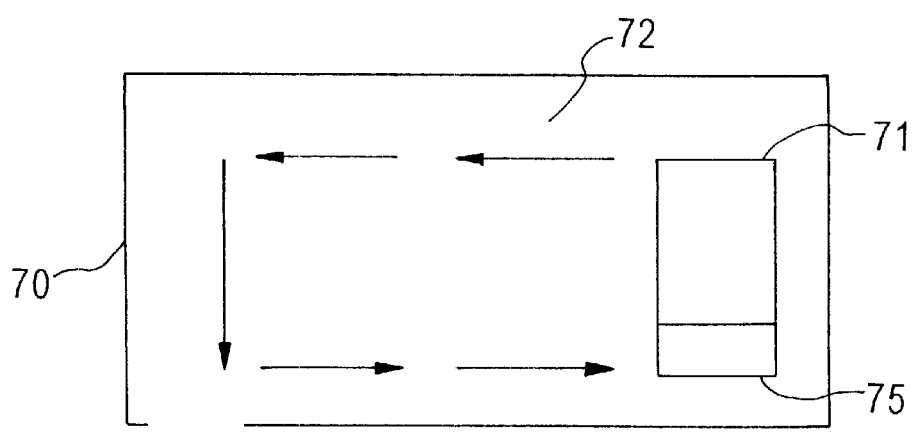

Reference is now made to FIGS. 5(a) and 5(b) which illustrate possible installations of ITM CVD with CVD tools.

FIG. 5(a) illustrates an ITM CVD) 65 integrated inside a cluster CVD tools 60 which is composed of several chambers such as the CVD 61 and cooling down 62 chambers. The ITM CVD 65 can be installed into one of the cooling down chambers 62, or into any other chamber suitable for this purpose. FIG. 5(b) illustrates a non-cluster CVD equipment 70. It includes a cassettes load/unload station 71, a conveyor 72 which moves the wafer from one station to the next station of the CVD) sub-processes. The ITM CVD 75 can be installed in the vicinity of the cassettes load/unload station 71.

According to another preferred embodiment of the present invention, channel 400 the of the integrated apparatus is based on UV optical components. Its optical scheme is similar to that presented in FIG. 3(a), where channel 300 serves for positioning using visible light and channel 400 serves for UV measurements.

Figure 6:
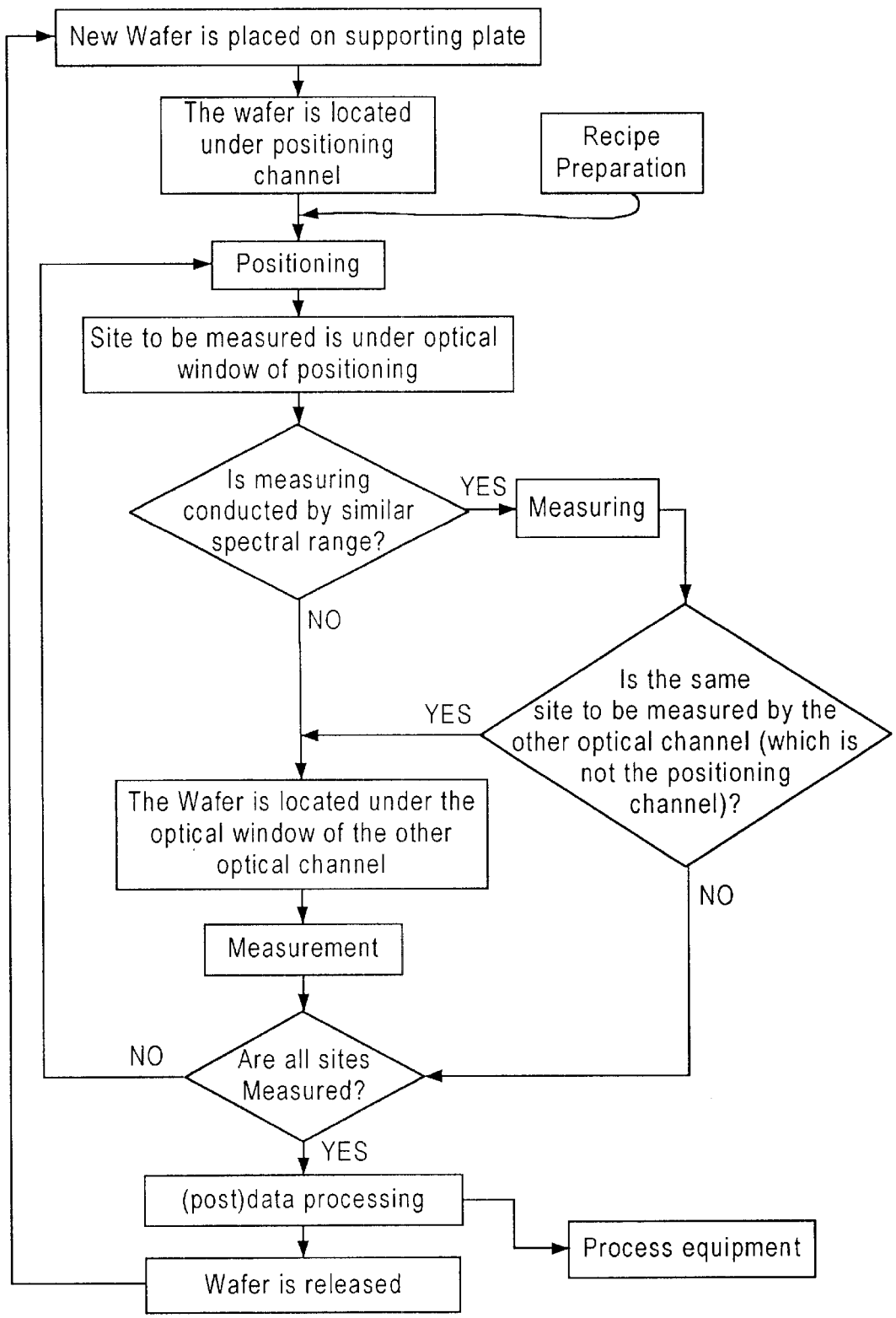
FIG. 6 is a flow chart of a method for integrated monitoring and control of CVD process.
Figure 7A:
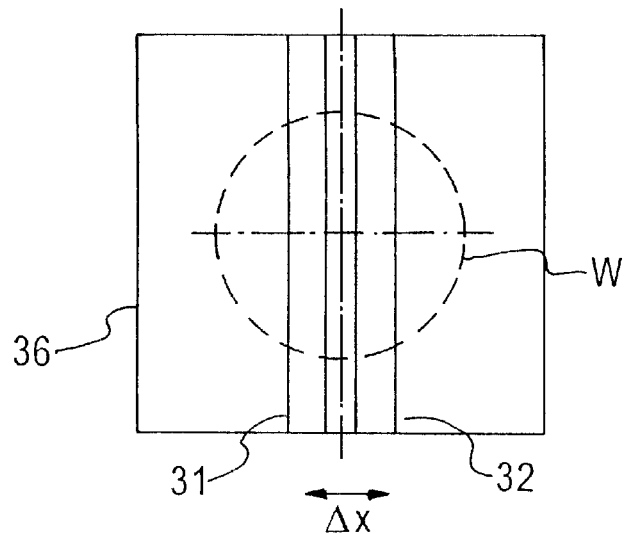
FIGS. 7(a) and 7(b) illustrate a side view and a top view of a possible initial configuration of the integrated apparatus.
Figure 7B:
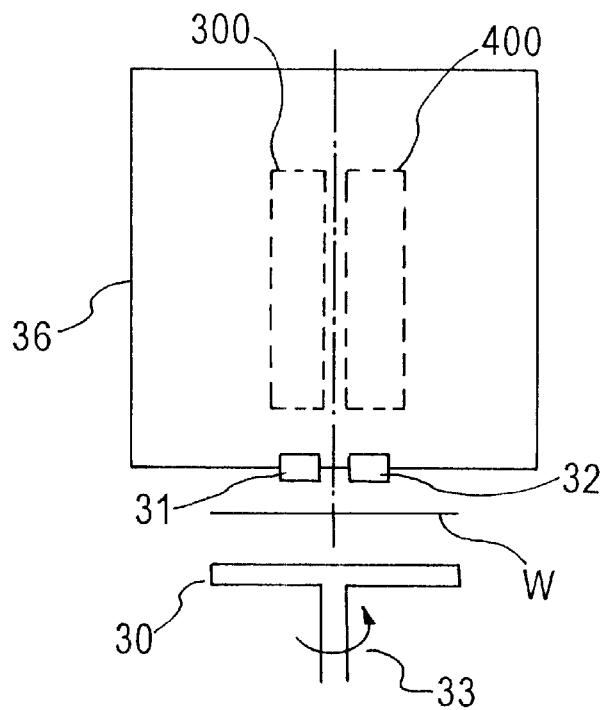
Figure 8A:
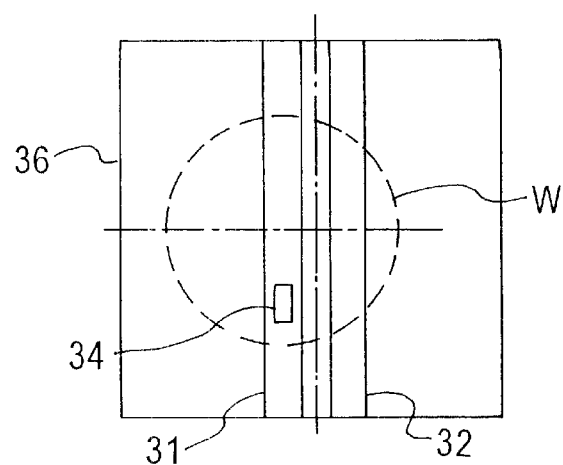
FIGS. 8(a) and 8(b) are schematic illustrations of respectively, side view and top view of the integrated apparatus when the positioning channel is operated.
Figure 8B:
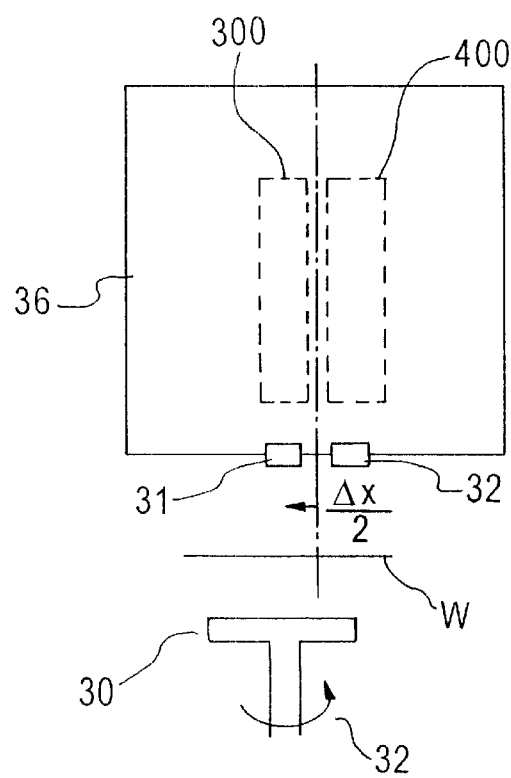
Figure 9A:
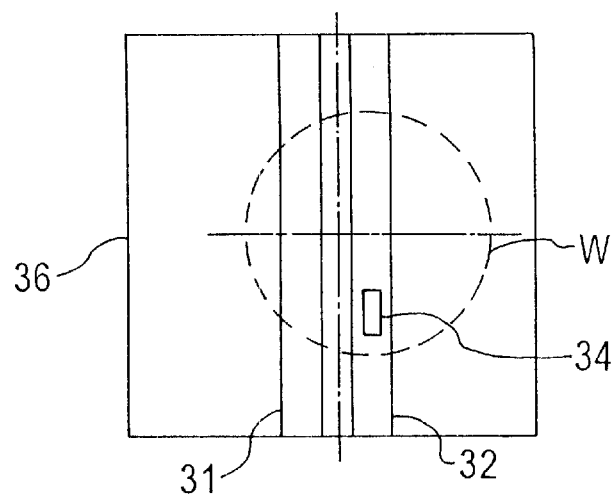
FIGS. 9(a) and 9(b) are schematic illustrations of respectively, a side view and a top view of the integrated apparatus when the measurement channel is operated.
Figure 9B:
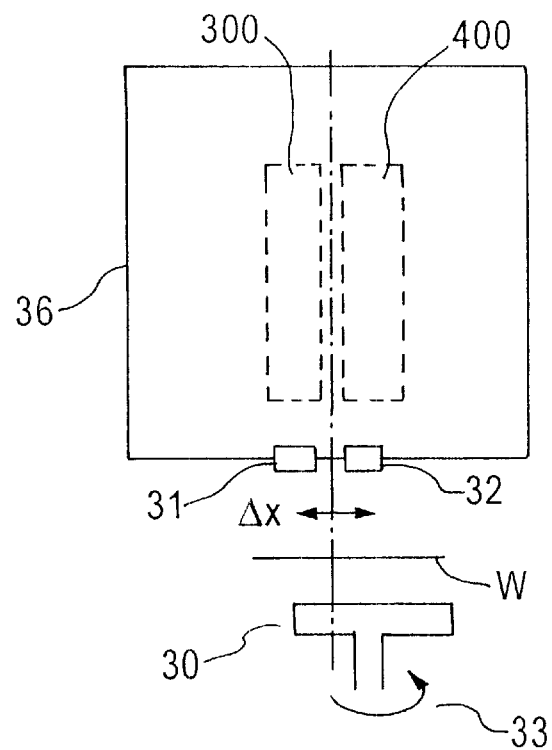

A reference is made to FIG. 6 which illustrates a method according to the present invention for operating an integrated apparatus which uses at least two different spectral ranges. This method is elucidated with the aid of FIGS. 7–9. As shown in FIGS. 7(a) (top view) and 7(b) (side view), the supporting means 30 is located under the sealed enclosure 36. At the next step, the supporting means 30 accurately moves the wafer w by a pre-determined distance $\Delta x/2$ and locates the wafer under the optical window 31 of the positioning channel 300 as shown schematically in FIGS. 8(a) and 8(b). If the wafer w is not aligned, pre-alignment can be performed according to any known method such as that which is disclosed in U.S. application Ser. No. 09/097, 298 now U.S. Pat. No. 6,038,029 Final positioning can be conducted according to any known method such as the method disclosed in U.S. Pat. No. 5,682,242 based on patterned features. Alternatively, the whole positioning step can be conducted (without rotating the wafer) according to the method disclosed in U.S. Pat. No. 5,682,242. During the positioning step, the optical head 34 may move along the optical window 31 followed by (or simultaneously) rotation of the wafer w by rotation means 33 in order to locate under the optical window 31 any point of the wafer w. When positioning is completed and the predetermined site (defined during recipe preparation) is found, measuring commences. If the spectral range used for measuring is similar to that used for positioning, measuring is conducted with the same channel 300. However, if spectral range in addition to or other than that used for positioning is needed for measuring or detection, the supporting means 30 accurately moves the wafer w by a distance $\Delta x$ and locates it under the optical window 32 of the measuring channel, and measuring is conducted as shown in FIGS. 9(a) and 9(b). According to another preferred embodiment of the present invention, an accurate x-y stage for the optical head 34 is designed (accurate to a level to be determined). Then an accurate translation along x axis between windows 31 and 32 is performed, as well as along the y axis, in order to locate the measuring channel 400 above the pre-determined site to be measured.

It should be noted that if y translation of the optical head and rotation means 33 are designed to be accurate enough, once positioning is completed, there is no need for the linear translation of the optical head 34 along the x axis. Instead, the processed positioning data is used by the CU 120 to accurately positioning (by accurate movement according to polar $(r,\psi)$ coordinates system) the pre-determined site under optical window 32 and under the optical head 34 in a measuring position. This mode of operation is beneficial in eliminating additional x axis and corresponding $\Delta x$ movement. However, in this case, a small central area of about $\Delta x/2$ radius can not be reached by both channels.

Actually both modes of operation may be used. When a measurement site is located near the wafer center, the additional $\Delta x$ movement is needed. However, when other sites located far from the wafer's center are to be measured, only combined rotation of the supporting means and y translation of the optical head are used.

The aforementioned process is repeated when several sites on the wafer w are to be measured. It should be noted that there are cases, in which the whole wafer w is measured (e.g., inspection), i.e., the supporting means 30 directly moves the wafer w under optical window 32 of the measuring channel 400, skipping over the alignment channel 300. The measured data is transferred to the control unit 120 which can instruct the measuring unit 110 itself with respect to its operation (e.g., sampling frequency, sites number to be measured on a wafer). Simultaneously or alternatively, these data can be used for a feedback (or feed forward, depend on the configuration) closed loop control to the processing equipment such as the CVD tools.

According to the present invention, the integrated tool can have more than two optical windows (not shown) for each measuring channel which applies different spectral ranges which require different material to enable the electromagnetic radiation to pass, e.g., an integrated tool using visible, deep UV, Infrared and x-rays illumination and/ or detection. In this case, either the supporting means 30 or the movable head 34, should have accurate translation means with appropriate motion control to enable locating a pre-determined site on the wafer to be measured under the appropriate measuring channel.

While specific embodiments of the present invention had been described for the purpose of illustration they do not mean to limit the scope of the invention. It will be understood that the invention may be carried into practice by skilled persons with many modifications, variations and adaptations, without departing from its spirit or exceeding the scope of the claims.

What is claimed is:

1. An integrated apparatus for monitoring a semiconductor wafer and for process control in a semiconductor production line by means of optical measurements in more than one spectral ranges, said apparatus comprising:
   a measuring unit for performing the optical measurements at predetermined locations on the wafer;
   light sources for illuminating the wafer,
   a supporting element for holding, rotating and translating the wafer; and
   a control unit coupled to and controlling said measuring unit, said supporting element and said light sources;

wherein said measuring unit comprises:
   a) at least two separate optical units operating in different distinct spectral ranges;
   b) at least two separate elongated optical windows which are spaced from each other by a distance d and through which the wafer is illuminated, each of said optical windows corresponding to one of said optical units and having a length equal to or longer than a radius of the wafer;
   c) a movable optical head which accommodates some or all of optical components of said optical units; and
   d) a positioning element for translating said optical head relatively to a surface of the wafer along the length of said optical windows and along an axis perpendicular to the surface of the wafer, so that each of said optical units can measure an area of the wafer through the corresponding optical window and perform autofocusing.

2. The apparatus according to claim 1, wherein either said supporting element or said positioning element is configured to perform an accurate linear translation, along a direction perpendicular to the length of said optical windows, within a distance equal to a center-to center distance $\Delta x$ of said optical windows.

3. The apparatus according to claim 1, wherein said positioning element comprises rails on which said optical head is mounted, and a motor which drives a screw connected to said optical head to move said optical head along the rails.

4. The apparatus according to claim 1, wherein said measuring unit is placed in a sealed enclosure.

5. The apparatus according to claim 1, wherein at least one of said light sources is external to said measuring unit, and light generated by said at least one light source is conveyed to said measuring unit by a suitable light guide.

6. The apparatus according to claim 1, wherein movable parts of more than one of said optical units are installed in said movable optical head.

7. The apparatus according to claim 1, further comprising a plurality of said moveable optical heads, movable parts of each of said optical units are installed in separate one of said movable optical heads.

8. The apparatus according to claim 1, wherein said apparatus is installed inside processing equipment in the semiconductor production line.

9. The apparatus according to claim 8, wherein said processing equipment is one of Chemical Vapor Deposition, Chemical Mechanical Polishing, and photocluster equipment.

10. The apparatus according to claim 1, wherein said apparatus is attached to processing equipment in the semiconductor production line.

11. The apparatus according to claim 10, wherein said processing equipment is one of Chemical Vapor Deposition, Chemical Mechanical Polishing, and photocluster equipment.

12. The apparatus according to claim 1, wherein said apparatus is installed inside one of cooling chambers of cluster Chemical Vapor Deposition equipment in the semiconductor production line.

13. The apparatus according to claim 1, wherein said apparatus is installed in the vicinity of a cassette load/unload station of non-cluster Chemical Vapor Deposition equipment in the semiconductor production line.

14. The apparatus according to claim 1, wherein one of said optical units comprises a visible illumination source and optical components suitable for optical measurements in the visible spectral range, and another of said optical units comprises optical components and illumination sources suitable for optical measurements in a spectral range other than the visible spectral range, or at a specific wavelength.

15. The apparatus according to claim 14, wherein the optical unit operating in the visible spectral range further includes an optical imaging device.

16. The apparatus according to claim 1, wherein the measuring unit comprises first and second said optical units;
the first optical unit comprises a visible illumination source and optical components suitable for optical measurements in the visible spectral range, signals generated by the first optical unit are relayed to said positioning element for positioning the moveable optical head relatively to the wafer and used for thin layer thickness measurements; and
the second optical unit comprises an infrared illumination source and optical components suitable for optical measurements in the infrared spectral range, signals generated by the second optical unit are used for layer composition measurements and a contamination analysis.

17. The apparatus according to claim 1, wherein the measuring unit comprises first and second said optical units;
the first optical unit comprises a visible illumination source and optical components suitable for optical measurements in the visible spectral range, signals generated by the first optical unit are relayed to said positioning element for positioning the moveable optical head relatively to the wafer and used for thin layer thickness measurements; and
the second optical unit comprises an ultraviolet illumination source and optical components suitable for optical measurements in the ultraviolet spectral range, the second optical unit further comprises a detector for receiving and measuring ultraviolet light reflected off the wafer after being illuminated thereon by the ultraviolet illumination source.

18. The apparatus according to claim 1, wherein the measuring unit comprises first and second said optical units;
the first optical unit comprises a visible illumination source and optical components suitable for optical measurements in the visible spectral range, signals generated by the first optical unit are relayed to said positioning element for positioning the moveable optical head relatively to the wafer and used for thin layer thickness measurements; and
the second optical unit comprises an X-ray illumination source and optical components suitable for optical measurements in the X-ray spectral range, the second optical unit further comprises a detector for receiving and measuring an X-ray beam reflected off the wafer after being illuminated thereon by the X-ray illumination source.

19. The apparatus according to claim 1, wherein one of the windows can be opened for a predetermined period of time.

20. An integrated apparatus for monitoring a semiconductor wafer and for process control in a semiconductor production line by means of optical measurements in more than one spectral ranges, said apparatus comprising:

a measuring unit for performing the optical measurements at predetermined locations on the wafer;

light sources for illuminating the wafer, a supporting element for holding, rotating and translating the wafer; and a control unit coupled to and controlling said measuring unit, said supporting element and said light sources;

wherein said measuring unit comprises:

a) more than two separate optical units operating in different distinct spectral ranges;

b) more than two separate adjacent optical windows through which the wafer is illuminated, each of said optical windows corresponding to one of said optical units and being elongated in an elongation direction;

c) at least one movable optical head which accommodates some or all of optical components of said optical units; and d) a positioning element for translating said at least one optical head relatively to the wafer's surface along the elongation direction, so that each of said optical units can measure an area of the wafer through the corresponding optical window and perform autofocusing; and wherein either said supporting element or said positioning element is configured to either perform a continuous translation along a transverse direction perpendicular to the elongation direction of said optical windows or have several accurate positions along the transverse direction.

21. An integrated apparatus for monitoring a semiconductor wafer and for process control in a semiconductor production line by means of optical measurements in more than one spectral ranges, said apparatus comprising:

a measuring unit for performing the optical measurements at predetermined locations on the wafer;

light sources for illuminating the wafer, a supporting element for holding, rotating and translating the wafer; and a control unit coupled to and controlling said measuring unit, said supporting element and said light sources;

wherein said measuring unit comprises:

a) at least two separate optical units operating in different distinct spectral ranges;

b) at least two separate optical windows through which the wafer is illuminated, each of said optical windows corresponding to one of said optical units;

c) at least one movable optical head which accommodates some or all of optical components of said optical units; and d) a positioning element for translating said at least one optical head relatively to a surface of the wafer, so that each of said optical units can measure an area of the wafer through the corresponding optical window and perform autofocusing; and wherein one of the windows can be opened for a predetermined period of time.

* * * * *